United States Patent [19]
Cheng

[11] Patent Number: 4,755,867
[45] Date of Patent: Jul. 5, 1988

[54] VERTICAL ENHANCEMENT-MODE GROUP III-V COMPOUND MISFETS

[75] Inventor: Chu-Liang Cheng, Piscataway, N.J.

[73] Assignee: American Telephone and Telegraph Company, AT&T Bell Laboratories, Murray Hill, N.J.

[21] Appl. No.: 896,772

[22] Filed: Aug. 15, 1986

[51] Int. Cl.$^4$ .......................................... H01L 29/78
[52] U.S. Cl. .................................. 357/23.2; 357/23.4; 357/55
[58] Field of Search ...................... 357/23.2, 23.4, 55, 357/23.15

[56] References Cited
U.S. PATENT DOCUMENTS
4,568,958 2/1986 Baliga ................................ 357/23.4

OTHER PUBLICATIONS

"Channel Mobility Enhancement in InP Metal-Insulator-Semiconductor Field-Effect Transistors", *Applied Physics Letters*, vol. 46, No. 4, 1985, pp. 416–418, K. P. Pande.
"X-Band Self-Aligned Gate Enhancement-Mode InP MISFETs", *Electron Device*, vol. ED-30, 1983, pp. 811–815, T. Itoh, et al.
"High-Power InP MISFETs", *Electron Letters*, vol. 19, No. 12, 1983, pp. 433–434, M. Armand, et al.
"Monolithically Integrated $In_{0.53}Ga_{0.47}As$-PIN/InP-- MISFET Photo-Receiver", *Electron Letters*, vol. 20, 1984, pp. 314–315, K. Kasahara, et al.
"Growth of Fe-Doped Semi-Insulating InP by MOCVD", *Journal of Crystal Growth*, vol. 69, 1984, pp. 10–14, J. A. Long, et al.
"The Effect of Gas Temperature on the Growth of InP by Atmospheric Pressure Metal-Organic Chemical Vapor Deposition Using Trimethyl Indium and $PH_3$ Sources", *Journal of Electronic Materials*, vol. 14, 1985, pp. 563–572, J. L. Zilko, et al.

*Primary Examiner*—Andrew J. James
*Assistant Examiner*—Mark Prenty
*Attorney, Agent, or Firm*—Michael J. Urbano

[57] ABSTRACT

A vertical, enhancement mode InP MISFET includes a conducting n-type substrate, a semi-insulating Fe-doped InP blocking layer on the substrate, a conducting layer formed in the blocking layer, a groove which extends through both the conducting layer and the blocking layer, a borosilicate dielectric layer formed on the walls of the groove, a gate electrode formed on the dielectric layer, drain electrodes formed on each side of the gate electrode, and a source electrode formed on the bottom of the substrate. When a positive gate voltage relative to the source is applied, conduction channels are formed along the sidewalls of the groove, and current flows vertically from drain to source.

8 Claims, 1 Drawing Sheet

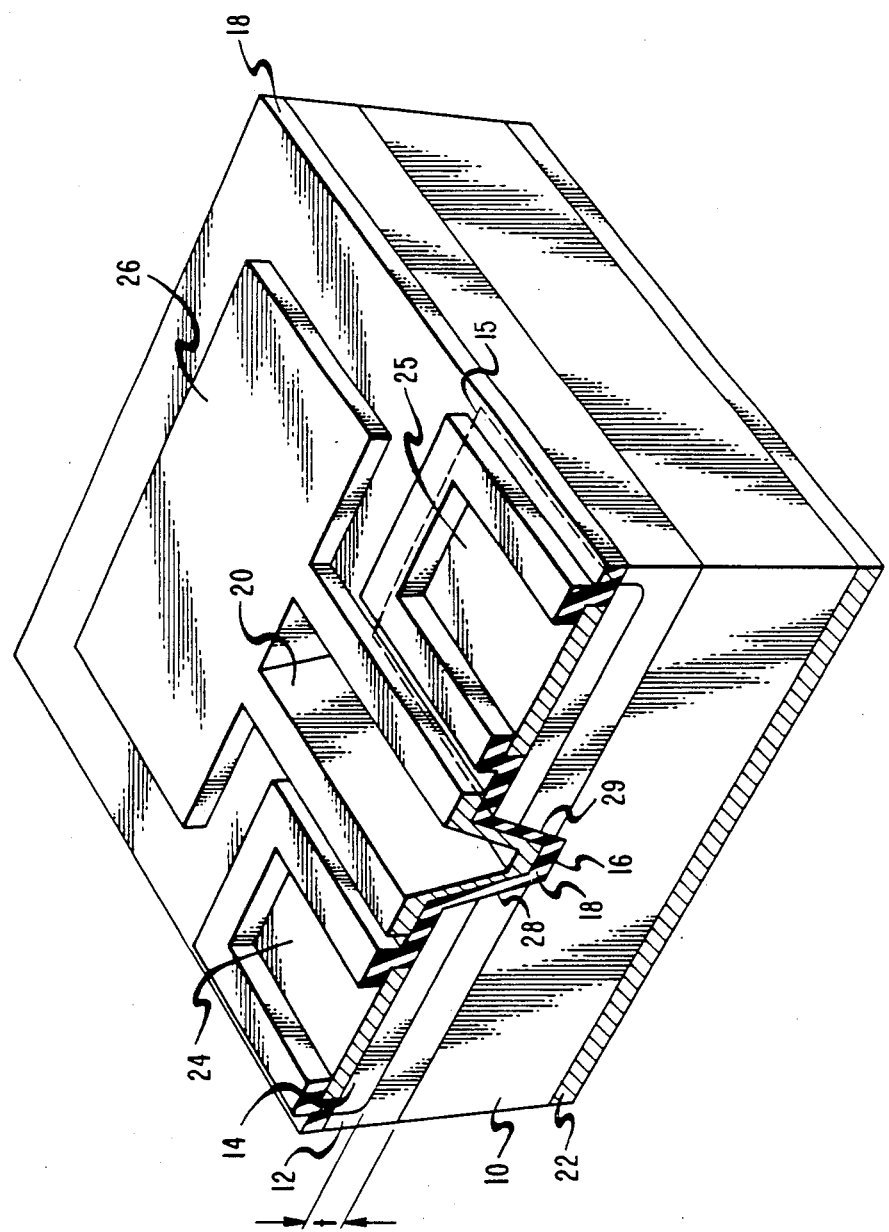

VERTICAL ENHANCEMENT-MODE GROUP III-V COMPOUND MISFETS

BACKGROUND OF THE INVENTION

This invention relates to field-effect transistors (FETs) and, more particularly, to Group III-V compound vertical FETs.

Excellent material properties such as high electron mobility, high electron peak velocity, low ionization coefficients and good thermal conductivity make InP a good material candidate for FET applications. Among the possible gate technologies for making InP transistors, the insulated-gate technology shows the most promise, and metal-insulator-InP devices with interface state densities as low as $8 \times 10^{10} cm^{-2} eV^{-1}$ have been reported. (see for example, K. P. Pande, *Applied Physics Letters*, Vol. 46, No. 4, p. 416, (1985)). High performance InP metal-insulator-semiconductor FETs operating both in depletion and enhancement mode (T. Itoh et al., *Electron Devices*, Vol. ED-30, No. 7, p. 811, (1983)) may find application in high speed digital circuits, in high frequency power amplification (M. Armand et al., *Electron Letters*, Vol. 19, No. 12, p. 433, (1983)), and, in particular, in integrated optoelectronics for long wavelength optical telecommunication (see, for example, K. Kasahara et al., *Electron Letters*, Vol. 20, p. 314, (1984)).

In order to define a finite channel depth, FETs in III-V compounds are conventionally fabricated on semi-insulating substrate. For depletion-mode devices, the active channel is formed either by epitaxial growth or ion implantation, and for enhancement-mode devices by carrier (electron) accumulation on the surface of the semi-insulating substrate. The need for a semi-insulating substrate for such FETs hampers the monolithic integration of photonic and electronic devices, since most of the photonic devices (e.g. laser diodes and PIN photodiodes) are usually fabricated on conducting (e.g., n-type) substrate. Furthermore, the etch pit density of commercially available semi-insulating InP substrate is too high for high quality, high yield optoelectronic device fabrication.

SUMMARY OF THE INVENTION

We have avoided the need for a semi-insulating substrate in the fabrication of FETs and have thus devised an FET design which facilitates monolithic integration of photonic and electronic devices. To achieve this end in accordance with one aspect of my invention a semi-insulating Group III-V compound epitaxial blocking layer is grown on a conducting single crystal Group III-V compound substrate. A vertical enhancement-mode FET is realized by forming a conductive surface layer in the blocking layer and a groove which extends through the blocking layer to the substrate. A thin dielectric layer is formed along at least one wall of the groove, and a gate electrode is formed on the dielectric layer. Drain and source electrodes are also formed on the FET, one on the bottom of the substrate and the other, on the conductive surface layer adjacent the gate electrode. When a suitable gate voltage relative to the substrate is applied, a conduction channel is formed along the sidewall of the groove, and current flows vertically between the drain and source electrodes.

In an alternative parallel channel embodiment, which enhances the power capability of the FET, the dielectric layer and gate electrode are formed along opposite walls of the groove so that channels are formed along each wall.

In a preferred embodiment, the blocking layer comprises Fe-doped InP grown by organo-metallic chemical vapor deposition (OMCVD).

BRIEF DESCRIPTION OF THE DRAWING

My invention, together with its various features and advantages, can be readily understood from the following, more detailed description taken in conjunction with the accompanying drawing, in which the sole FIGURE is a schematic, perspective view of an FET in accordance with one embodiment of my invention. In the interest of clarity the FIGURE has not been drawn to scale.

DETAILED DESCRIPTION

Turning now to the Figure, there is shown a vertical enhancement mode FET comprising a Group III-V compound semiconductor conducting body 10, a semi-insulating Group III-V compound semiconductor epitaxial blocking layer 12 formed on one major surface of body 10, and a conductive Group III-V compound semiconductor surface layer 14 formed in the blocking layer 12 on the side thereof remote from body 10. A groove 16 extends through both the blocking layer 12 and conductive layer 14 into the body 10, and a dielectric layer 18 is formed along at least one sidewall 28 or 29 of the groove 16. Alternatively, as shown, the dielectric layer 18 is formed along both sidewalls of groove 16. Although a trapezoidal groove is depicted, other geometric shapes such as a V-groove are also suitable.

A gate electrode 20 is formed on the dielectric layer 18. Source and drain electrodes are also formed on the FET; one of the source and drain electrodes is formed on the other major surface of body 10 while the other is formed on conductive layer 14 adjacent gate electrode 20. Illustratively, source electrode 22 is formed on the bottom of body 10, and drain electrode 24-25 is formed as separate segments on layer 14 on each side of gate electrode 20. Conversely, the drain electrode could be formed as a single electrode on the bottom of body 10, in which case the source electrode would be formed on layer 14 as a single metal layer or as separate segments.

To facilitate electrical connection, the gate electrode is extended beyond the end of the groove 16 to form a pad 26. Dielectric layer 18 thus covers not only the walls of the groove 16 but also the top surface of the device including the area under pad 26, but excluding the windows which allow access to electrodes 24-25.

In operation, when both drain electrodes 24 and 25 are used, and when a suitable gate voltage relative to the source electrode 22 is applied, two conduction channels are formed, one along the sidewall 28 of the groove 16 and one along sidewall 29. Current flows vertically between the source and drain by means of charge flow through the channels. The blocking layer 12 prevents any significant current flow elsewhere. Alternatively, one drain electrode, say 25, may be left electrically floating or may be omitted, in which case a single channel along sidewall 28 would be formed. Illustratively, the body 10 and layer 14 are n-type semiconductors in which case enhancement mode operation results when a positive gate voltage relative to the source electrode 22 is applied.

In a preferred embodiment, the body 10 comprises a conductive n-type InP substrate, the blocking layer 12 comprises an Fe-doped semi-insulating InP layer grown by OMCVD as described by J.A. Long et al., *Journal of Crystal Growth*, Vol. 69, p. 10, (1984). The conducting layer 14 may be formed in a number of ways including by separate epitaxial growth or by diffusion of impurities into layer 12, but the preferred technique is to implant ions (e.g. Si ions) into the desired areas of layer 12. In any case, the conducting layer 14 should extend to the sidewalls 28 and 29 of the groove 16 so as to contact the channels formed at those walls. The dotted line 15 shows in phantom the surface dimensions of layer 14 on one side of gate electrode 20; i.e., under drain electrode 25. Layer 14 has similar surface idimensions ont he other side of gate electrode 20. Similarly, the groove 16 may be formed by any suitable etching technique, and the dielectric layer 18 may be formed by any suitable deposition technique, although the thermal evaporation of a borosilicate glass film to form layer 18 is preferred.

An illustrative process sequence for fabricating my FET includes the following principal steps. A semi-insulating layer 12 is epitaxially grown on substrate 10, and conducting layer 14 is ion-implanted into a surface portion of layer 12. Using standard photolithography (PL), a patterned mask is formed on layer 12 so that the drain electrodes 24 and 25 may be deposited. Using PL again, the mask is further patterned and the groove 16 is formed by etching. Then, the source electrode 22 may be deposited on the bottom of substrate 10. There are, however, other suitable places in the sequence for the latter step to be performed. Next, dielectric layer 18 is formed over the top surface, and PL is used to define the desired areas for deposition of the gate electrode 20 and pad 26. Layer 18 is then patterned using PL once again to define windows over the drain electrodes 24 and 25. The windows are opened by etching so as to expose electrodes 24 and 25 for electrical contacting purposes.

This process produces two channels, one along each sidewall 28 and 29. However, well-known techniques, such as angle evaporation of the gate electrode 20 (and possibly layer 18) in the groove, may be employed so that a single channel is formed along only one sidewall.

EXAMPLE

The following example describes the fabrication and operation of an InP enhancement mode vertical FET in accordance with one embodiment of my invention. Various materials, dimensions, operating conditions and other parameters are provided by way of illustration only and, unless otherwise stated, are not intended to limit the scope of the invention.

The body 10 comprises a (100)-oriented n-type InP substrate (carrier concentraiton $n \sim 10^{18}$ cm$^{-3}$). A 2 $\mu$m-thick Fe-doped InP semi-insulating blocking layer 12 was grown by atmospheric pressure OMCVD using a vertical geometry system well known in the art (see, J. L. Zilko et al., *Journal of Electronic Materials*, Vol. 14, p. 563 (1985)). The sources of In and P were trimethylindium and phosphine, with ferrocene used as the source of Fe.

The active area of the devices was patterned using standard PL, and a selective Si+ ion implant with a dose of $1 \times 10^{13}$ cm$^{-2}$ at 50 KeV was performed at a substrate temperature of 200° C. to form conductive layer 14. The implant was annealed, using the well known close contact method, at 650° C. for 15 minutes. The activation efficiency was $\sim 80\%$ with a peak carrier concentration of $\sim 10^{18}$ cm$^{-3}$. After forming ohmic source electrode 22 and drain electrodes 24-25, a trapezoidal-groove 16 was etched through both conductive layer 14 and the Fe-doped semi-insulating layer 12 into the n+substrate 10. Then, a borosilicate (85% $SiO_2$ and 15% $B_2O_3$) of low alkaline content ($<10$ ppm) approximately 380 Å thick was deposited over the entire top surface by thermal evaporation at a rate of less than 1 Å/sec, at an elevated substrate temperature of 250° C. Using standard PL again, aluminum was deposited to form gate electrode 20 (including pad 26), and contact windows were opened in layer 18 to expose electrodes 24 and 25.

Before etching the groove, the characteristics of the Fe:InP epilayer after ion implant and high temperature activation were studied. A capacitance-voltage plot between the top and bottom contacts (i.e., the drain and source contacts) showed that the capacitance remained constant up to 10 volts and then increased exponentially. From the constant capacitance value the thickness of the Fe-doped semi-insulating layer 12 between layer 14 and body 10 was estimated to be 1.72 $\mu$m. The leakage current (through the Fe-doped layer 12) versus applied voltage characteristics in the dark and under illumination were also measured. The current was approximately proportional to the voltage (i.e., ohmic) below 1 volt, and the resistivity was estimated to be $3.4 \times 10^8$ ohm-cm. The current varied quadratically with voltage between 1 and 10 volts, and then increased rapidly with voltage. Above 10 volts the high injection current caused charge accumulation, and therefore the corresponding capacitance increased sxponentially. The capacitance-voltage (C/V) and current-voltage (I-V) studies suggest that about 10 volts was the upper limit for device operation for this particular design.

The InP MISFET as shown in the Figure has the gate and drain electrodes on the top surface (i.e., on layer 14), while the source electrode is on the bottom surface (i.e., on body 10). When a positive gate voltage relative to the source is applied, a conduction channel is formed along the surface of the sloped sidewall, and current flows vertically from drain to source. The source electrode can be easily grounded without using a bonding lead, thereby minimizing source inductance. Since there are only two electrodes on the top surface, long gate width FETs for power applications can easily be fabricated without problems associated with interconnection crossovers. Furthermore, the device is fabricated on an n-type substrate and can be integrated with other photonic devices.

The current-voltage characteristics of the InP enhancement-mode MISFET were measured for an FET in which the device width was about 90 $\mu$m and the gate length was approximately 2.8 $\mu$m. The gate length is defined as the thickness t of the unimplanted portion of layer 12 (i.e., the portion between implanted layers 14 and body 10) divided by the sine of the angle of the oblique sidewall 28. The devicd width is defined by the dimension of the implanted layer 14 measured parallel to the axis of the groove times two for two channels. (Note, because the figure is a cross section, only a fraction of the device width is shown.) The gate insulator was approximately 300 Å thick (the "planar" or horizontal thickness of layer 18 multiplied by the cosine of the angle of the oblique sidewall 28). The transconductance was higher than 100 mS/mm at +1.4 volt gate bias, with a drain saturation current of 70 mA/mm. The drain saturation current $I_{DS}$ followed the classical quadratic relation: $I_{ds} = Z\mu C_i(V_G - V_{th})^2/2L$, where Z is the device width, $\mu$ is the effective mobility, $C_i$ is the insulator capacitance, L is the gate length and $V_{th}$ is the threshold voltage. From a $\sqrt{I_{DS}}$ versus $V_G$ plot the effective channel mobility and the threshold voltage were calculated to be 2300 cm$^2$/Vs and 0.13 V, respectively.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What is claimed is:

1. A vertical field-effect transistor comprising:
    a Group III-V compound conductive body having one conductivity type and a pair of major surfaces,
    a Group III-V compound semi-insulating epitaxial blocking layer formed in one of said major surfaces,
    a conductive Group III-V compound layer formed in said blocking layer on the side thereof remote from said body, said conductive layer having said one conductivity type,
    said blocking layer and said conductive layer having a groove which extend therethrough to said body,
    a dielectric layer formed along at least one wall of said groove,
    a gate electrode formed on said dielectric layer and along said one wall, and
    source and drain electrodes formed on said transistor, one of said source and drain electrodes being formed on said other major surface of said body and the other being formed on said conductive layer adjacent said gate electrode.

2. The transistor of claim 1 wherein said body, said blocking layer, and said conductive layer each comprises InP.

3. The transistor of claim 2 wherein said blocking layer comprises Fe-doped InP grown by OMCVD.

4. The transistor of claim 1, 2 or 3 wherein said conductive layer is formed by implantation of ions into said blocking layer.

5. The transistor of claim 4 wherein said ions comprise Si.

6. The transistor of claim 4 wherein said dielecric layer comprises borosilicate glass.

7. The transistor of claim 1, 2 or 3 wherein said dielectric layer is formed along at least two walls of said groove, and said gate electrode is formed on said dielectric layer and along said two walls.

8. The transistor of claim 7 wherein the other of said source and drain electrodes is formed on said conductive layer as separate segments, one on each side of said gate electrode.

* * * * *